(12) United States Patent
De Troz

(10) Patent No.: US 10,036,597 B2
(45) Date of Patent: Jul. 31, 2018

(54) EVAPORATOR WITH SIMPLIFIED ASSEMBLY FOR DIPHASIC LOOP

(71) Applicant: CALYOS SA, Jumet (BE)

(72) Inventor: Vincent De Troz, Nivelles (BE)

(73) Assignee: CALYOS SA, Jumet (BE)

( * ) Notice: Subject to any disclaimer, the term of this patent is extended or adjusted under 35 U.S.C. 154(b) by 234 days.

(21) Appl. No.: 14/903,272

(22) PCT Filed: Jul. 31, 2014

(86) PCT No.: PCT/EP2014/066473
§ 371 (c)(1),
(2) Date: Jan. 6, 2016

(87) PCT Pub. No.: WO2015/014929
PCT Pub. Date: Feb. 5, 2015

(65) Prior Publication Data
US 2016/0131438 A1    May 12, 2016

(30) Foreign Application Priority Data
Aug. 1, 2013   (FR) ...................... 13 57678

(51) Int. Cl.
| F28F 7/00 | (2006.01) |
| F28D 15/04 | (2006.01) |
| F28D 15/02 | (2006.01) |
| H01L 23/427 | (2006.01) |
| B23P 15/26 | (2006.01) |

(52) U.S. Cl.
CPC ............ *F28D 15/043* (2013.01); *B23P 15/26* (2013.01); *F28D 15/0266* (2013.01); *F28D 15/046* (2013.01); *H01L 23/427* (2013.01); *H01L 2924/0002* (2013.01)

(58) Field of Classification Search
CPC .. F28D 15/043; F28D 15/0266; F28D 15/046; B23P 15/26; H01L 23/427; H01L 2924/0002
USPC ....................................... 165/80.4
See application file for complete search history.

(56) References Cited

U.S. PATENT DOCUMENTS 2,200,200 A  *  5/1940  Donnelly ................. B65D 3/22
                                                    220/495.07
3,090,116 A  *  5/1963  Burgess ................. B23K 20/12
                                                    228/115
(Continued)

FOREIGN PATENT DOCUMENTS

| DE | 202009005595 U1 * | 8/2009 | ............ F25B 23/006 |
| DE | 202009005595 U1 | 9/2009 | |
| EP | 0739647 A1 | 10/1996 | |

*Primary Examiner* — Justin Jonaitis
(74) *Attorney, Agent, or Firm* — Seed IP Law Group LLP

(57) ABSTRACT

An evaporator for a diphasic heat transfer system with capillary pumping, includes a base plate with a peripheral edge and an outer face for receiving heat receiving calories from a dissipative element, a body with a bottom, side portions and a border adjacent to the peripheral border of the base plate, a porous mass forming a layer with a capillary structure, interposed between the base plate and the bottom, which defines a first gas chamber and a second liquid chamber, the body being assembled on the base plate by crimping, such that there is no need for a gluing, screwing, riveting or welding operation to obtain a tight assembly of the evaporator.

15 Claims, 4 Drawing Sheets

(56) References Cited

U.S. PATENT DOCUMENTS

| | | | | |
|---|---|---|---|---|
| 4,833,567 A | * | 5/1989 | Saaski | F28D 15/0233 |
| | | | | 165/104.26 |
| 4,883,116 A | * | 11/1989 | Seidenberg | F28D 15/043 |
| | | | | 122/366 |
| 5,016,705 A | * | 5/1991 | Bahrle | B60H 1/00 |
| | | | | 165/104.14 |
| 5,998,863 A | | 12/1999 | Kobayashi et al. | |
| 6,097,597 A | * | 8/2000 | Kobayashi | F28D 15/0233 |
| | | | | 165/104.14 |
| 6,550,530 B1 | * | 4/2003 | Bilski | F28D 15/043 |
| | | | | 165/104.25 |
| 2003/0051859 A1 | * | 3/2003 | Chesser | F28D 15/043 |
| | | | | 165/46 |
| 2007/0006992 A1 | | 1/2007 | Liu et al. | |

\* cited by examiner

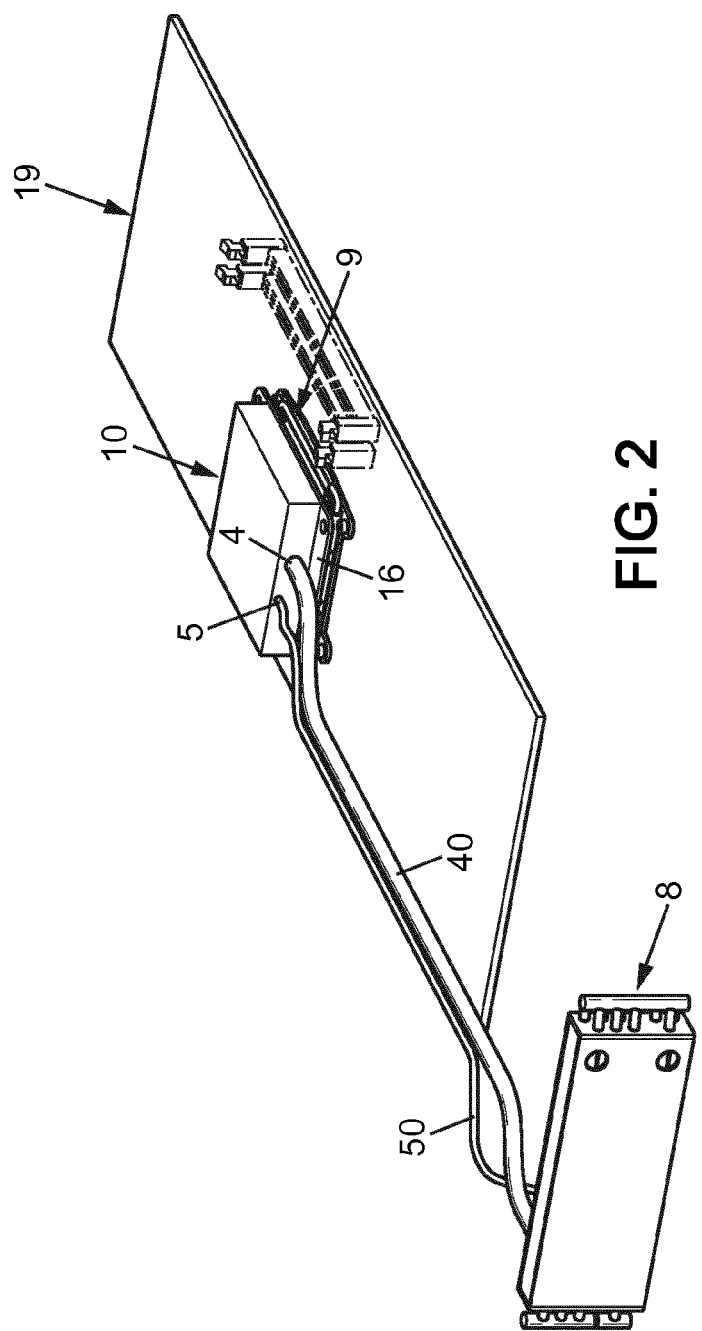

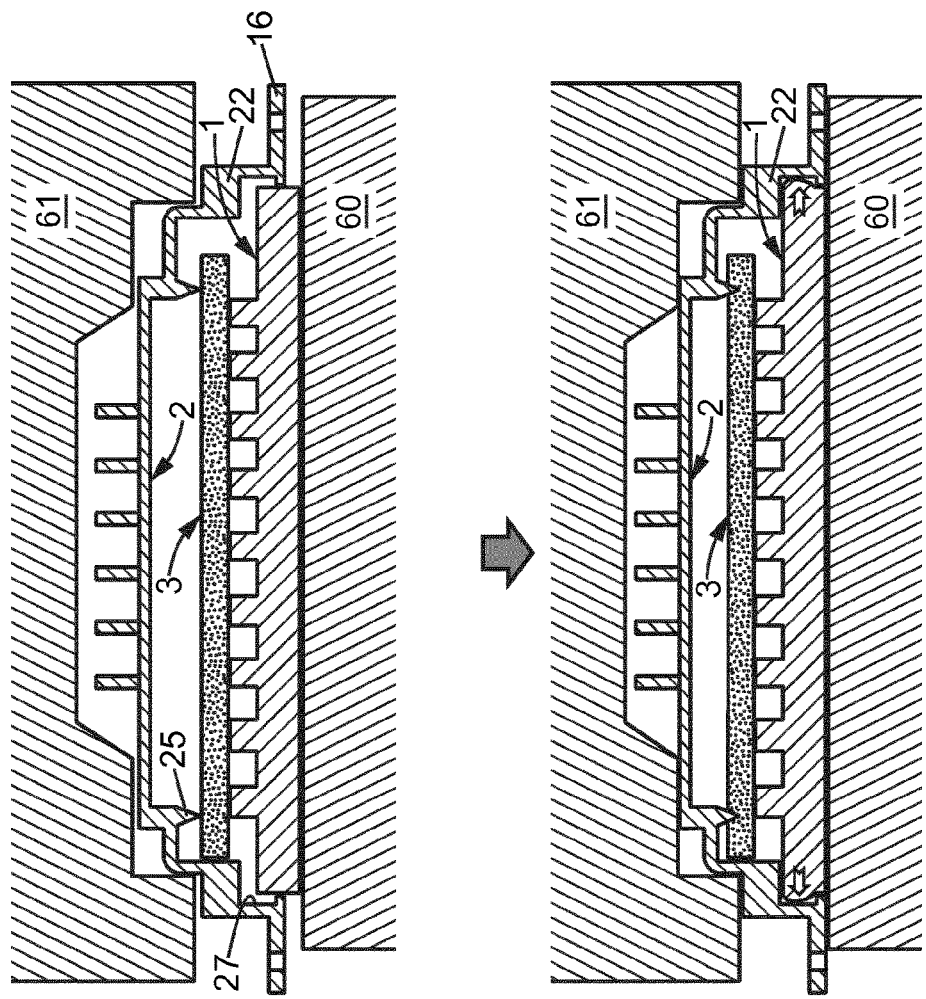

EVAPORATOR WITH SIMPLIFIED ASSEMBLY FOR DIPHASIC LOOP

BACKGROUND

Technical Field

The present invention relates to evaporators for two-phase thermal transfer systems with capillary pumping.

More specifically, the invention relates to forming and assembling such evaporators, in particular those intended to remove heat produced generally by a dissipative element, in particular, but not exclusively, by any electronic processor or any electronic switching device.

Description of the Related Art

The expansion of data exchanged over the Internet network has led to an enormous need for calculating and storage power in servers serving to address the needs of users and in particular these servers are often gathered together in centers called "data centers".

The cooling needs of the electronic boards making up the servers in these data centers never stops growing because the density of processors in these boards is always higher.

Using air or liquid fluid circulation for cooling the processor on a server board is known. The circulation of such a fluid requires the use of one or several fans or one or several pumps which can be subject to failure or at least require regular maintenance.

It is therefore preferable to use a passive system, meaning one without an active pump, in order to extract the heat from processors; this type of system uses a capillary pumping phenomenon. Such a system is described in the patent application US2003/051859; however, the condenser function still calls for a fan and additionally the evaporator placed above each processor is complex to produce and consequently costly. Furthermore the bulk and reliability of operation of such an evaporator can be improved.

A need therefore appeared for reducing the cost of such evaporators without impact on the performance thereof, in order to be able to offer two-phase thermal transfer systems with capillary pumping for various applications with large production volumes.

BRIEF SUMMARY

For that purpose, the invention proposes especially an evaporator for a two-phase thermal transfer system with capillary pumping, including:

a base plate with a peripheral edge and an outer surface for thermal reception intended to receive heat from a dissipative element, where the outer surface generally extends along an interface plane P adjacent to the dissipative element;

a body with a back, lateral portions and a border adjacent to the peripheral edge of the base plate in order to delimit an inner space for the evaporator in that way;

a porous mass forming a capillary structure layer, interposed between the base plate and the back, which defines a first chamber delimited by the base plate, the lateral portions and said porous mass and a second chamber delimited by the back, the lateral portions and said porous mass;

where the first chamber is intended to house the working fluid in essentially gaseous phase, and includes an evaporator outlet for a tubular gas conduit, where the second chamber is intended to house the working fluid in essentially liquid phase, and includes an evaporator inlet for a tubular liquid conduit, characterized in that the body is assembled on the base plate by a crimping operation during which a hermetic seal between the base plate and the body is formed by material flow.

In that way, a bonding, screwing, riveting or welding operation in order to obtain a sealed assembly of the evaporator is avoided.

Because of these provisions, an evaporator which is particularly simple to assemble and therefore particularly low cost is obtained. In that way a controlled, potentially automatable and fully repeatable assembly process is achieved and mass production at a very attractive price can therefore be considered.

In embodiments of the process according to the invention, it is additionally possible to use of one and/or another of the following provisions:

Advantageously a joint projection integrally formed with the body and projecting towards the base plate is provided which projects into the porous mass such that a capillary seal is provided between the first and second chambers. In other words, the capillary seal avoids vapor short-circuiting the porous member and entering into the second chamber which is harmful to the performance of the system. In that way, with a single crimping operation one chamber is sealed from the other and the evaporator is globally sealed from the outside environment.

The joint projection can be formed by a lip having a section with a pointed end directed towards the base plate by means of which the penetration of the joint lip into the porous mass is easier and the depth of penetration in that way gives a good seal between the first chamber and the second chamber.

The outer surface of the base plate can be substantially flat and can be configured in order to press against a processor on an electronic board forming the dissipative element, such that this evaporator is particularly well-suited for cooling systems for electronic boards and in particular cooling processors or CPUs which are mounted thereon.

The evaporator can have a thickness E, along a direction perpendicular to the plane P, less than 35 mm, such that such an evaporator can be easily integrated on a "1U" format server processor card, meaning a thickness of order 45 mm.

The evaporator inlet and outlet are arranged parallel to the plane P in one of the lateral walls, such that the occupied volume perpendicular to the plane P is not increased by the fluid inlet, outlet and conduits.

The base plate can include projections projecting inward, where these projections form vapor recovery channels and form spacers for holding the porous mass, such that it is possible to use a very simple porous layer without machining, where the vapor channels result from the shapes of the base plate.

The porous mass can form a layer of constant thickness parallel to the interface plane P, such that a very low price porous element can be used, which is simply cut to the right length and right width without other preparation.

The base plate has a rectangular shape and the body has a rectangular shape with four sides forming the lateral portions, such that the base plate can be perfectly suited to the geometry of a processor or CPU onto which it is installed and the body is a part with a geometry that is simple to produce.

The base plate is made of copper and the body is stainless steel, by means of which the base plate has a very good thermal transfer coefficient and an adequate ductility for the crimping operation. Furthermore, the body has adequate features of durability and compatibility with fluids.

The body includes fins arranged on the outer surface of the back of the body, such that if gas bubbles were to form in the second liquid chamber, they would re-condense under the cooling effect of the fins.

The body includes means for attachment to the electronic card, for example in the form of lateral extensions parallel to the plane P, preferably screw holes. In this way the capacity for integration of the evaporator onto an electronics board is improved and the overall cost of the cooling function reduced.

The border for the body includes a groove in which the material coming from deformation of the peripheral edge of the base plate comes to be lodged during crimping, by means of which the complementary shapes of the base plate and the body are optimized in order to obtain a quality crimping assuring the sealing of the inner space of the evaporator.

The invention also targets a process for assembling and evaporator such as one of the type described above, where the process comprises the steps:
providing a base plate;
providing a cover;
placing a porous material on top of the base plate;
crimping the cover onto the base plate in order to form by material flowing/creeping a hermetic seal between the base plate and the body.

Advantageously a capillary seal is simultaneously formed between the two chambers by penetration of the joint projection into the porous mass.

Finally, the invention also targets a two-phase thermal transfer system with capillary pumping comprising an evaporator such as one of the type described above.

BRIEF DESCRIPTION OF THE SEVERAL VIEWS OF THE DRAWINGS

Other features and advantages of the invention will become apparent during the following description of one of the embodiments thereof, given as a nonlimiting example, with reference to the attached drawings. In the drawings:

FIG. 2 is a general perspective view of a cooling device incorporating an evaporator according to the invention.

FIGS. 5 and 6 illustrate the process for obtaining the evaporator by crimping.

In the various figures, the same references designate identical or similar items.

DETAILED DESCRIPTION

Figure 1:
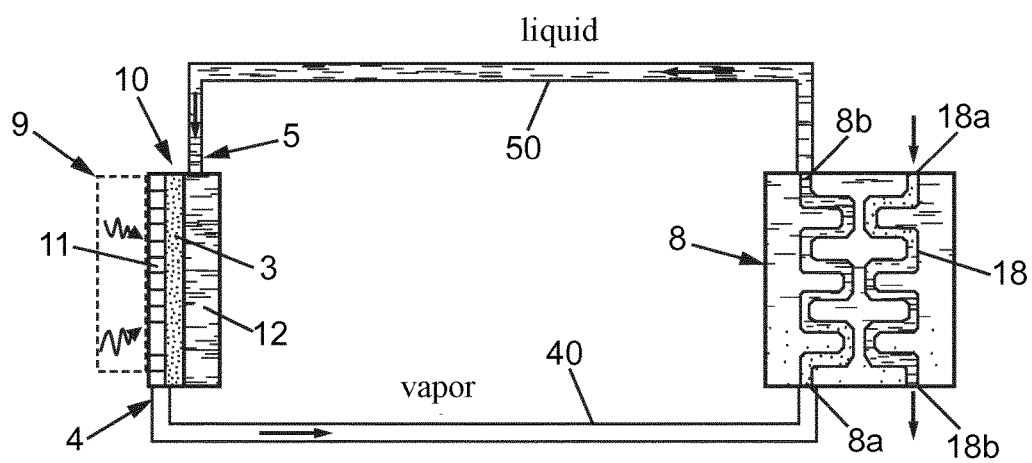
FIG. 1 is a general schematic view of a two-phase loop cooling system incorporating an evaporator according to the invention.

FIG. 1 shows a sample closed-circuit two-phase loop cooling device which includes an evaporator 10, a condenser module 8, a first fluid pipe 40 referred to as "vapor" connecting the outlet of the evaporator to the inlet of the condenser module and a second fluid conduit 50 referred to as "liquid" connecting the outlet of the condenser module to the inlet of the evaporator.

The circulation of a two-phase working fluid is assured via the capillary effect prevailing in a porous mass 3 disposed inside the evaporator 10. Said porous mass 3 separates a first chamber 11 in thermal contact with the heat source and generally intended to contain the working fluid in gaseous phase, and a second chamber 12 arranged in the evaporator opposed from the heat source and intended to contain the heating fluid mainly in liquid phase.

As is well known, the thermal energy supplied near the evaporator transforms the liquid into vapor during which it absorbs an energy equivalent to the latent heat of vaporization of the working fluid. The vapor created in that way is directed under pressure into the first conduit 40 towards the inlet 8*a* of the condenser module. In this area, the working fluid gives up the heat thereof either directly to the environment or to another liquid fluid 18 in forced circulation (as is shown: inlet 18*a*, outlet 18*b*), and in this way the working fluid returns to liquid phase after having released energy corresponding to the latent heat.

The liquid fluid of the outlet 8*b* of the condenser is aspirated by the pumping effect provided by the capillary structure of the porous mass, with the second chamber and the conduit 50 being filled with working fluid in liquid phase.

Such capillary pumping systems are known under the acronyms LHP (Loop Heat Pipe) or CPL (Capillary Pumped Loop) and are used both in a gravity-less environment (space) and in terrestrial applications with gravity.

It needs to be remarked that FIG. 1 does not mention the vertical direction and consequently there is no specific constraint concerning the orientation and respective positions of the evaporator and the condenser module in so long as the capillary pumping effect remains greater than the effects of gravity considering the density of the fluid used.

According to the present invention, the main target is terrestrial systems with high-volume or mass production applications, meaning very large numbers of parts to be produced. In this context, a goal is to reduce the material cost and the production cost of the components of the system and in particular the capillary evaporator 10.

One of the applications targeted by the present invention relates (not exclusively) to the cooling of electronic boards and especially processors or CPUs which are mounted on electronic boards in computers, conventional servers or even in racks of server boards. FIG. 2 schematically shows an electronic board 19 equipped with at least one processor 9. In the configuration shown, the board is shown in horizontal position, but it could just as well be in vertical position.

The capillary evaporator 10 according to the invention configured for removing heat dissipated to the processor 9 according to a two-phase capillary loop process already described above is disposed on top of the processor 9.

The condenser module 8 is formed by a liquid/liquid type heat exchanger preferably with crossed flows, which is well known and therefore not described in detail here. The cooling fluid 18 will typically be water at the temperature at which it is available in the building or near the temperature of the surroundings or even slightly cooled.

Figure 3:
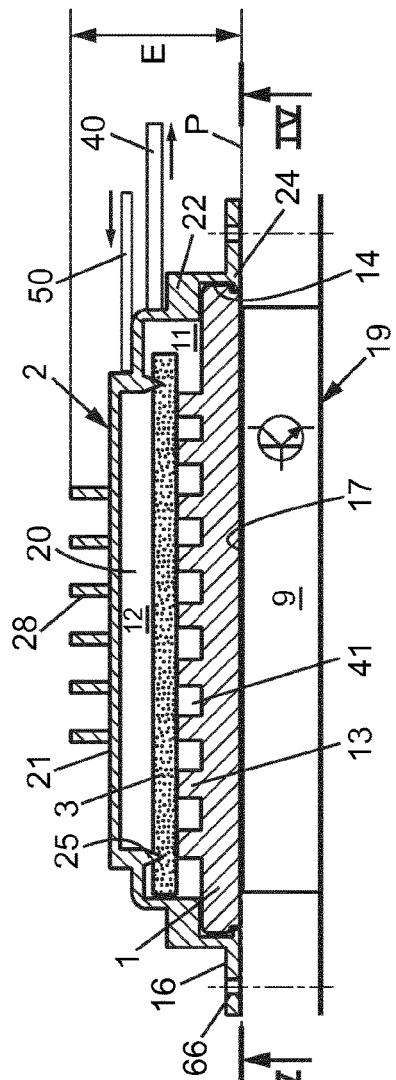
FIG. 3 is a transverse section view of an evaporator according to the invention.
Figure 4:
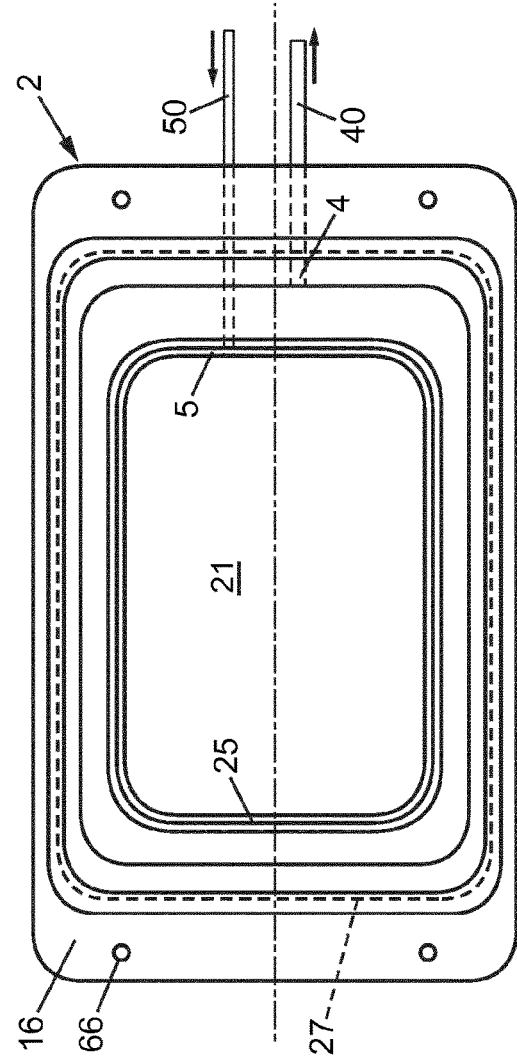
FIG. 4 shows a top view of the body of the evaporator from FIG. 3.

As shown in FIG. 3, the evaporator includes a base plate 1 intended to come into physical and thermal contact with the processor 9 along an interface plane P and a body 2 which complements the base plate in order to form an enclosure, corresponding to an inner space 20, in which are disposed the elements of the evaporator which will be described below.

The base plate 1 includes a peripheral edge 14 and an outer, thermal receiver, surface 17 intended to receive heat from a dissipative element such as the processor 9 in question. On the side opposite the outer surface, meaning the side referred to as "inner", a plurality of projections 13 formed as ribs extending continuously or discontinuously and preferably in parallel with each other are arranged so as to create channels 41 otherwise stated grooves intended to convey the vapor formed in this area towards the vapor outlet 4. The projections could also be pins arranged in a matrix or in staggered rows and separated from each other. Preferably the base plate is formed of copper, a material which has a very good coefficient of thermal conductivity and which furthermore has very good ductility whose interest will be seen later.

There is provided, located above the projections 13, a capillary structure layer which forms a porous mass 3, which in the example shown looks like a layer of constant thickness without any specific secondary shape. It is therefore sufficient to cut out a porous layer with the correct length and width dimensions; there is no need to machine vapor channels inside of this porous mass.

The makeup and the process for obtaining such a porous mass 3 is well known and are therefore not described in detail here.

The aforementioned body 2 for the evaporator is disposed above the base plate and the porous mass and this body is preferably made of stainless steel. This body 2 comprises a back 21, which forms a wall parallel to the plane P, lateral walls 22 which extend from the back all around the evaporator towards a border 24 which delimits the body 2 in the area of the interface plane P.

The border 24 and the peripheral edge 14 of the base plate are joined hermetically as will be detailed below.

In this way, a first chamber 11 referred to as "gaseous" is formed in the evaporator and delimited by the baseplate, lateral portions 22 and the porous mass 3. A second chamber 12 referred to as "liquid" is formed in the evaporator and delimited by the back 21 of the body, the lateral portions 22 and the porous mass 3.

The hermetic separation between the first and second chambers is made by a joint projection 25 integrally coming from the body; this joint projection projects towards the baseplate and penetrates into the porous mass in order to form a sealed barrier for the working fluid in this area.

A capillary seal is thus formed between the liquid chamber 12 and the vapor chamber 11, meaning more precisely that there are no other possible passages between the two chambers except passing by the thickness of the porous mass 3. In particular, this avoids any risk of hot vaporized liquid (vapor) passing into the liquid chamber, which would have the undesirable effect of increasing the temperature thereof and which would require re-condensing this vapor into liquid form by cooling it. The sealed closure formed by the joint projection 25 penetrating into the porous mass blocks any direct passage between the vapor chamber and the liquid chamber.

A poor capillary seal results in a risk of leakage from the vapor chamber 11 into the liquid chamber 12; such a leakage could have an effect of degrading the thermal performance (reduction of the maximum flow density and of the maximum transferable power).

More precisely, in the example illustrated here, the joint projection 25 has a sharp edge as a lip, meaning the lip has a generally triangular section with a pointed end.

Furthermore, the body 2 includes lateral extensions 16 obtained integrally by the shaping of the body 2; these lateral extensions extend preferably parallel to the plane P and are provided with holes 66. A well-known manner, spring-loaded screws (not shown) serve to press the evaporator against the processor.

Optionally, the back 21 of the body can have on the outer surface thereof a plurality of fins 28 whose function is to limit the heating of the liquid in the second chamber 12 and which also serve to re-condense gas bubbles which could have formed near the porous mass and which rise towards the back 21.

As shown in FIGS. 5 and 6, in order to assemble the evaporator 10, a base plate 1 is placed on a press base 60 and then a porous mass 3 layer is placed on the baseplate (as necessary on the projections 13 arranged on the baseplate as seen above) and then the body 2 is placed on top of the baseplate and the porous mass, where the border 24 of the body surrounds the peripheral edge 14 of the baseplate with a very reduced play. The end of the joint lip bears on the porous mass.

Next, a press punch 61 is arranged above the body 2 and then pressure is applied downward on the punch 61 in order to crimp the body onto the baseplate.

During the movement of the punch, there is both a ductile deformation of the peripheral edge of the baseplate (preferably of copper) and simultaneously the penetration of the end of the joint lip 25 into the porous mass 3.

Under the pressure exerted by the punch, the peripheral edge 14 of the baseplate comes to flow into a groove 27 provided for that purpose near the border 24 of the body 2 which results in a complementarity of shapes providing the seal.

Because of the arrangement described above, a thin assembled capillary evaporator results; in the example shown, the thickness E of the evaporator is less than 35 mm, even 30 mm, which allows for an easy integration on server cards arranged one above the other in racks.

Figure 7:
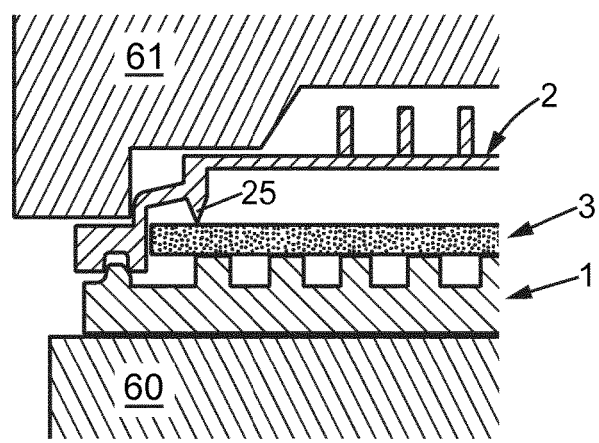
FIG. 7 shows an implementation variant concerning the border of the base plate and of the body.

As shown in FIG. 7, the border 24 the body 2 and the peripheral edge 14 of the baseplate can take various shapes, in particular the grooves in the body can be opened downward and the junction area between the two parts can be located away from the plane P.

Advantageously, the thickness E of the evaporator 10 along the direction perpendicular to the plane P is less than 35 mm, even less than 30 mm, which can allow this evaporator to be used in very confined spaces and which can make the integration thereof in various environments easier; in particular this solution is advantageous for cooling electronic boards.

In this respect, it should be remarked that the outlets 5, 4 for the liquid 50 and gas 40 conduits are arranged parallel to the plane P which does not increase the total thickness E of the evaporator 10.

It needs to be noted that the two-phase fluid capillary loop forms a passive system which does not require maintenance and does not generate fan or pump noise.

It should also be noted that a thermal contact grease can be interposed between the baseplate and the processor.

It should be noted that in order to improve the sealing performance of the closure the body 2 on the baseplate 1, it may be advantageous to add a ribbon of glue or adhesive (not shown) in the rounded corners of the groove 27 laid out in the body.

In order to improve the startup reliability of the two-phase loop, an anti-backflow device can be provided in the area of the discharge of the liquid inlet 5, where this anti-backflow device prevents the liquid from flowing back towards the condenser via the liquid conduit 50.

Of course, the crimped capillary evaporator described above can be used for removing heat from any element of the device, not just from an electronic processor.

The invention claimed is:

1. An evaporator for a two-phase thermal transfer system with capillary pumping, comprising:
   a metal base plate with a peripheral edge and an outer surface for thermal reception intended to receive heat from a dissipative element, where the outer surface generally extends along an interface plane P adjacent to the dissipative element;
   a metal body with a back, lateral portions and a border adjacent to the peripheral edge of the base plate, the body delimiting an inner space for the evaporator;
   a porous mass forming a capillary structure layer, interposed between the base plate and the back, which defines a first chamber, delimited by the base plate, the lateral portions, and said porous mass, and a second chamber delimited by the back, the lateral portions, and said porous mass;
   where the first chamber is configured to house a working fluid in gaseous phase, and includes an evaporator outlet for a tubular gas conduit, where the second chamber is configured to house the working fluid in liquid phase, and includes an evaporator inlet for a tubular liquid conduit, wherein the body is assembled on the base plate by a crimping operation during which a hermetic seal between the base plate and the body is formed by metallic material flow, without a bonding, screwing, riveting or welding operation in order to obtain a sealed assembly of the evaporator;
   wherein the border for the body includes a groove in which material coming from ductile deformation of the peripheral edge of the base plate comes to be lodged during crimping.

2. The evaporator according to claim 1, comprising a joint projection integrally formed with the body and projecting towards the base plate, which penetrates into the porous mass such that a capillary seal is provided between the first and second chambers.

3. The evaporator according to claim 2, wherein the joint projection is formed by a lip having a section with a pointed end directed towards the base plate.

4. The evaporator according to claim 1, wherein the outer surface is substantially flat and is configured in order to press against an electronic board processor forming the dissipative element.

5. The evaporator according to claim 4, wherein the evaporator has a thickness along a direction perpendicular to the plane P less than 35 mm.

6. The evaporator according to claim 1, wherein the evaporator inlet and outlet are arranged parallel to the plane P in one of the lateral walls.

7. The evaporator according to claim 1, wherein the base plate includes projections projecting inward, where these projections form vapor recovery channels and form spacers for holding the porous mass.

8. The evaporator according to claim 1, wherein the porous mass forms a layer of constant thickness parallel to the interface plane P.

9. The evaporator according to claim 1, wherein the base plate has a rectangular shape and the body has a rectangular shape with four sides forming the lateral portions.

10. The evaporator according to claim 1, wherein the base plate is copper and the body is stainless steel.

11. The evaporator according to claim 1, wherein the body includes fins arranged on the outer surface of the back of the body.

12. The evaporator according to claim 1, wherein the body includes lateral extensions parallel to the interface plane P, the lateral extensions having screw holes.

13. A process for assembly of an evaporator according to claim 1, the process comprising the steps:
   a—providing the metal base plate;
   b—providing the metal cover;
   c—placing the porous material on top of the base plate;
   d—crimping the cover onto the base plate in order to form, by metallic material flowing/creeping, the hermetic seal between the base plate and the body.

14. The process according to claim 13, wherein step d—a capillary seal is simultaneously formed between the first and second chambers by penetration of a joint projection into the porous mass such that a capillary seal is provided between the first and second chambers, the joint projection being integrally formed with the body and projecting towards the base plate.

15. A two-phase thermal transfer system with capillary pumping comprising the evaporator according to claim 1.

* * * * *